United States Patent
Li et al.

(10) Patent No.: US 7,227,812 B2
(45) Date of Patent: *Jun. 5, 2007

(54) WRITE ADDRESS SYNCHRONIZATION USEFUL FOR A DDR PREFETCH SDRAM

(75) Inventors: Wen Li, Boise, ID (US); Christopher K. Morzano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/398,269

(22) Filed: Apr. 5, 2006

(65) Prior Publication Data

US 2006/0198236 A1    Sep. 7, 2006

Related U.S. Application Data

(63) Continuation of application No. 10/894,269, filed on Jul. 19, 2004, now Pat. No. 7,054,222.

(51) Int. Cl.
*G11C 8/04* (2006.01)

(52) U.S. Cl. .................................. 365/240; 365/233

(58) Field of Classification Search ................ 365/240
See application file for complete search history.

(56) References Cited

U.S. PATENT DOCUMENTS

| | | | |
|---|---|---|---|
| 5,018,109 A * | 5/1991 | Shinoda et al. | 365/230.08 |
| 5,062,080 A | 10/1991 | Goldsmith | 365/230.01 |
| 5,384,750 A | 1/1995 | Lee | 365/233 |
| 5,526,316 A * | 6/1996 | Lin | 365/221 |
| 5,978,295 A * | 11/1999 | Pomet et al. | 365/221 |
| 6,067,632 A * | 5/2000 | Yamaguchi | 713/600 |
| 6,636,446 B2 | 10/2003 | Lee et al. | 365/194 |
| 2001/0000819 A1* | 5/2001 | Manning | 711/168 |

* cited by examiner

*Primary Examiner*—Tan T. Nguyen
(74) *Attorney, Agent, or Firm*—Wong, Cabello, Lutsch, Rutherford & Brucculeri (57) ABSTRACT

Disclosed herein are exemplary embodiments of an improved write address shift register structure useful for example in a DDR3 DRAM having read/write latency. The disclosed shift register structure propagates write addresses from an address bus outside the device to array decoders to allow latent data to be written into the cells in the memory array at a proper time. The register structure comprises a reduced number of registers (e.g., four) thus eliminating the need for extraneous registers which might otherwise be used to propagate "don't care" addresses. The registers are clocked, and the addresses propagated though the registers, in accordance with a latency bus through which a user defines the desired read/write latency in accordance with user preferences and the desired clock speed of the device. The clock for each register is preferably decoded from the latency bus and hence each register preferably has its own unique clock.

33 Claims, 12 Drawing Sheets

WRITE ADDRESS SYNCHRONIZATION USEFUL FOR A DDR PREFETCH SDRAM

CROSS REFERENCE TO RELATED APPLICATIONS

This application is a continuation of U.S. patent application Ser. No. 10/894,269, filed Jul. 9, 2004, now U.S. Pat. No. 7,054,222 which is incorporated herein by reference in its entirety and to which priority is claimed.

FIELD OF THE INVENTION

This invention relates to write address synchronization in integrated circuit devices having read/write latency, and is particularly but not exclusively useful in DDR SDRAMs using bit prefetching schemes.

BACKGROUND

Figure 1A:
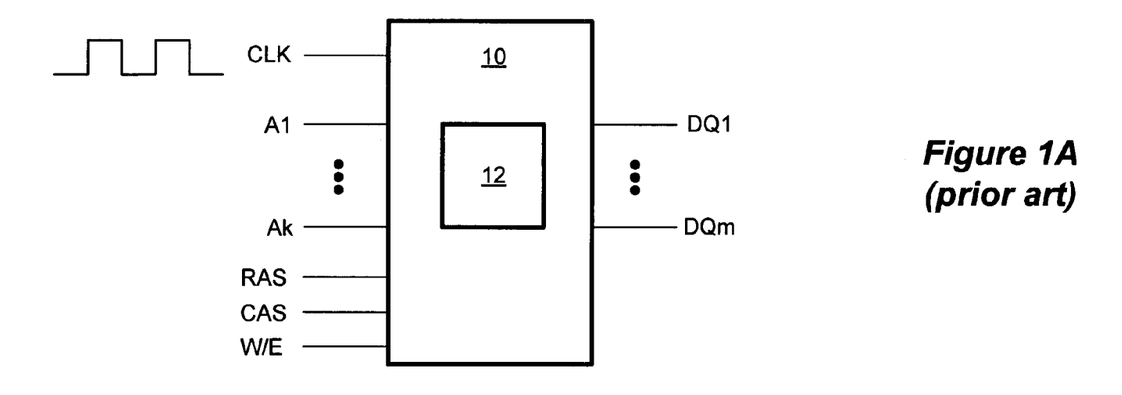
FIG. 1A illustrates a block diagram of a prior art SDRAM.

Synchronous dynamic random access memories (SDRAMs) are well known. In an SDRAM, and referring to FIG. 1A, data is written into and read out from the SDRAM 10 in synchronization with an external system clock signal (CLK). More specifically, when writing data to the array of cells 12 in the SDRAM 10, data is presented at the data lines (DQx) and at some discrete point during the clock's cycle—for example, on the clock's rising edge—this data enters the SDRAM 10 for eventual storage in the array 12 at an address specified by the address lines (Ax). Conversely, when reading data from the array 12, data is presented to the data lines (DQx) in accordance with the queried address on the address lines Ax, again at some discrete portion of the clock's cycle. Whether reading or writing is taking place is determined by the status of the row access strobe (RAS), column access strobe (CAS), and write enable (W/E) signals as is well known in DRAM technology. Ultimately these external signals are received from a system, such as a microprocessor system.

Figure 1B:
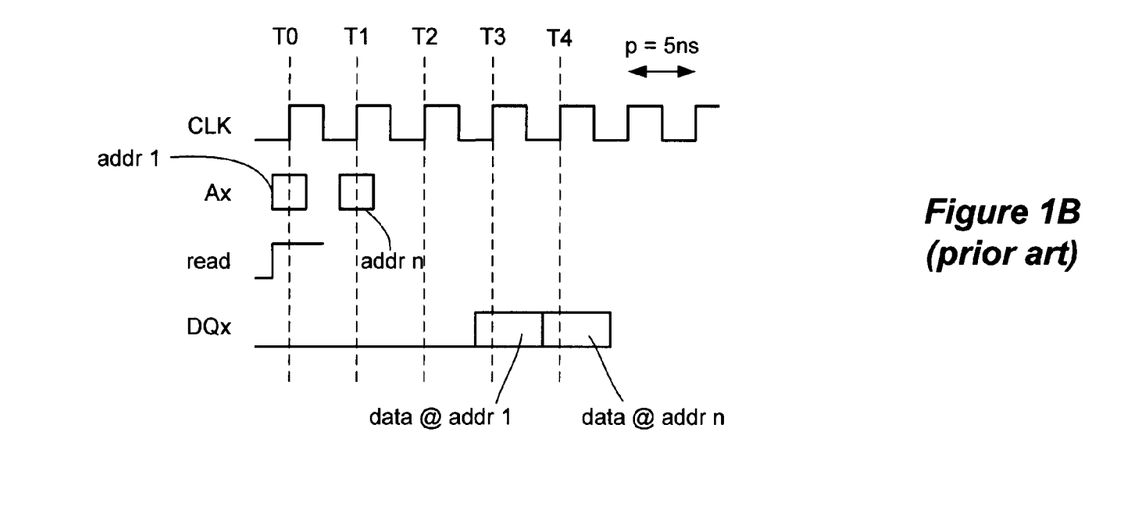
FIG. 1B illustrates the read latency of the SDRAM of FIG. 1A.

However, in an SDRAM, data can neither be written to nor read from the array 12 instantaneously. For example, it takes time for the data read from the array 12 to reach the data lines DQx. For example, in a typical device, it typically takes approximately 15 nanoseconds (ns) for data to move from the array 12 to the data lines DQx when a read has been initiated. Thus, and referring to FIG. 1B, if the system clock signal CLK has a period (p) of 5 ns, then if a read request is specified at time T0 at a first address (addr 1), the data from that address will appear at the data lines DQx after three clock cycles at T3. Accordingly, the device is said to have a "read latency" (or Column Access Strobe (CAS) latency) of 3 clock cycles. Thereafter, the next entered address (addr n) can be processed and its data presented at the data lines at T4.

Figure 2:
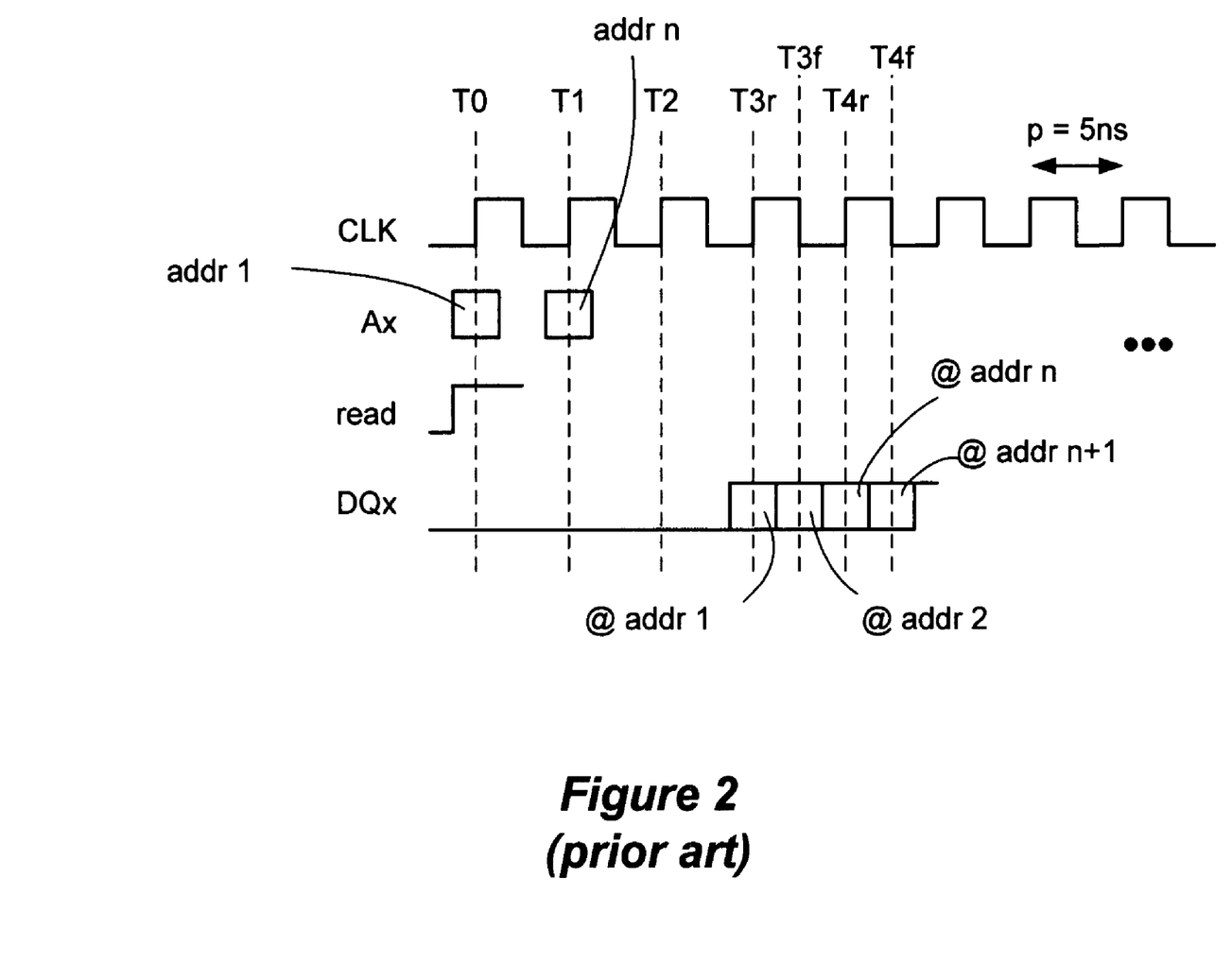
FIGS. 2–4 respectively illustrate the read latency of a DDR SDRAM, a DDR2 SDRAM and a DDR3 SDRAM.

A synchronous device which effectively provides for faster data transfer is a double data read (DDR) SDRAM. In a DDR SDRAM (hereinafter DDR), two data pipe lines are present in the device, one of which is active on the rising edge of the clock signal, and one of which is active on the falling edge of the clock signal. This is illustrated in FIG. 2. In a DDR, the address entered at T0, addr 1, is used to "prefetch" the data at that address and at the next sequential address (addr 2). The prefetched data at the two addresses are then output at the data lines DQx on the rising edge of T3 (T3r) and the falling edge of T3 (T3f). Thereafter, the next address (addr n) can be entered at T1, or the DDR can be configured to output the next sequential address (addr 3; not shown). The benefit of this approach is that twice the amount data can be output using the same clock signal, as data is output on both the rising and falling edges. In other words, for a 5 ns clock signal, two bits can be output on each data line DQx.

Figure 3:
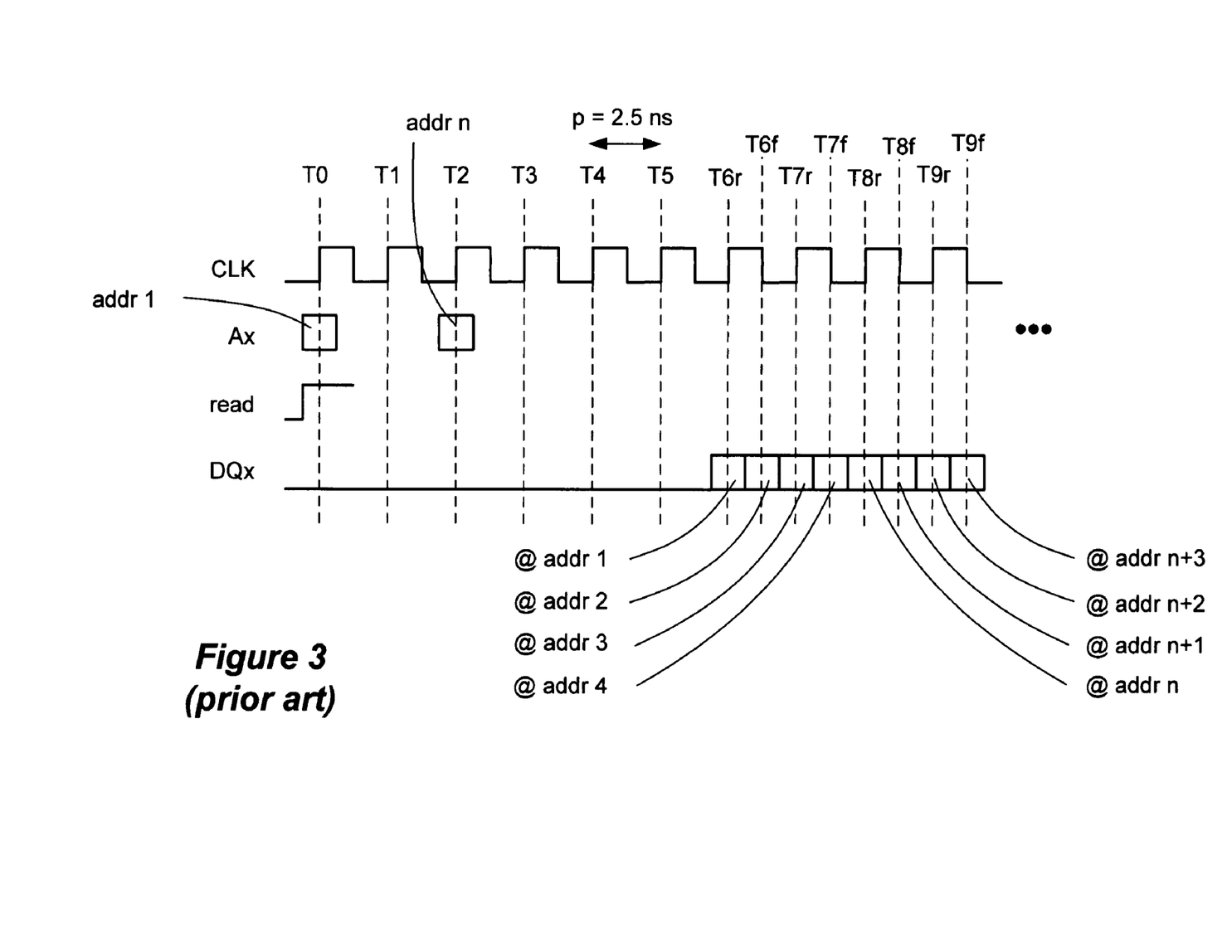

DDR2 improves up the technology of DDR by prefetching four bits instead of two, as illustrated in FIG. 3. DDR2 provides the benefit that the prefetched data can be presented at the data lines more quickly, allowing the clock cycle period (p) to be decreased by half (e.g., to 2.5 ns) when compared with a DDR device. Accordingly, due to the natural delay in reading the array, the first address of data occurs at the rising edge of T6 (T6r), thus establishing a read latency of 6. Moreover, the next address (addr n) cannot be presented until time T2, else the device will become "backed up" with data. In any event, using DDR2 technology, two bits can be output on each data line every 2.5 ns.

Figure 4:
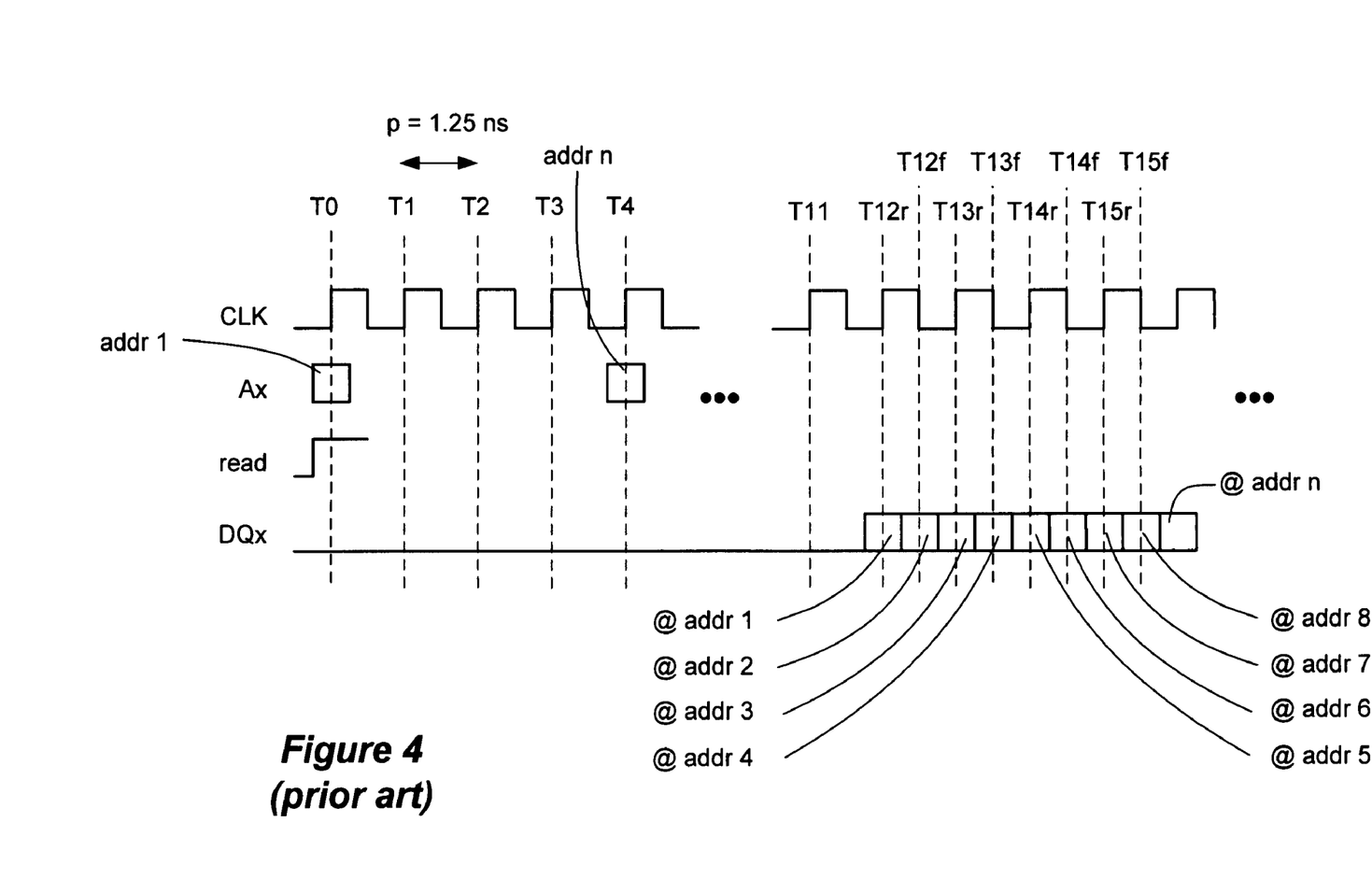

DDR3 represents the next generation of DDR technology, and essentially amounts to a further extension of DDR2. As illustrated in FIG. 4, DDR3 allows for an eight-bit prefetch and theoretically can run at an even further decreased clock cycle period (p) of 1.25 ns, although in reality the clock may run slightly slower in an actual DDR3 as will be explained momentarily. Accordingly, due to the natural delay in reading the array, the first address of data occurs at the rising edge of T12 (T12r), thus establishing a read latency of 12. Moreover, the next address (addr n) cannot be presented until a minimum time of T4.

DDR SDRAMs, such as DDR3, also have a write latency as well as a read latency. Write latency defines the number of clock cycles between presentation of an address at the address lines Ax and the actual presentation of the data at the data lines DQx to be stored at that address. Write latency is required because of the device's natural read latency. However, per user specifications, the write latency and read latency are generally not equal, but instead usually vary by one in an attempt to maximize usage of the data bus to which the data lines DQx are attached. More specifically, the write latency is preferably the read latency minus one.

In current DDR3s under development, it turns out that clock periods of 1.25 ns are difficult to achieve, although future reductions in sizes and capacitances will certainly make such clock speeds achievable in the near future. A more appropriate and slightly slower clock speed of 1.5 ns is thus currently targeted for such devices. Due to the natural 15 ns delay in reading the array as explained earlier, the read latency in a device with such a clock speed is 10 (15/1.5). Accordingly, the write latency is preferably 9 for the reasons noted above.

Figure 5:
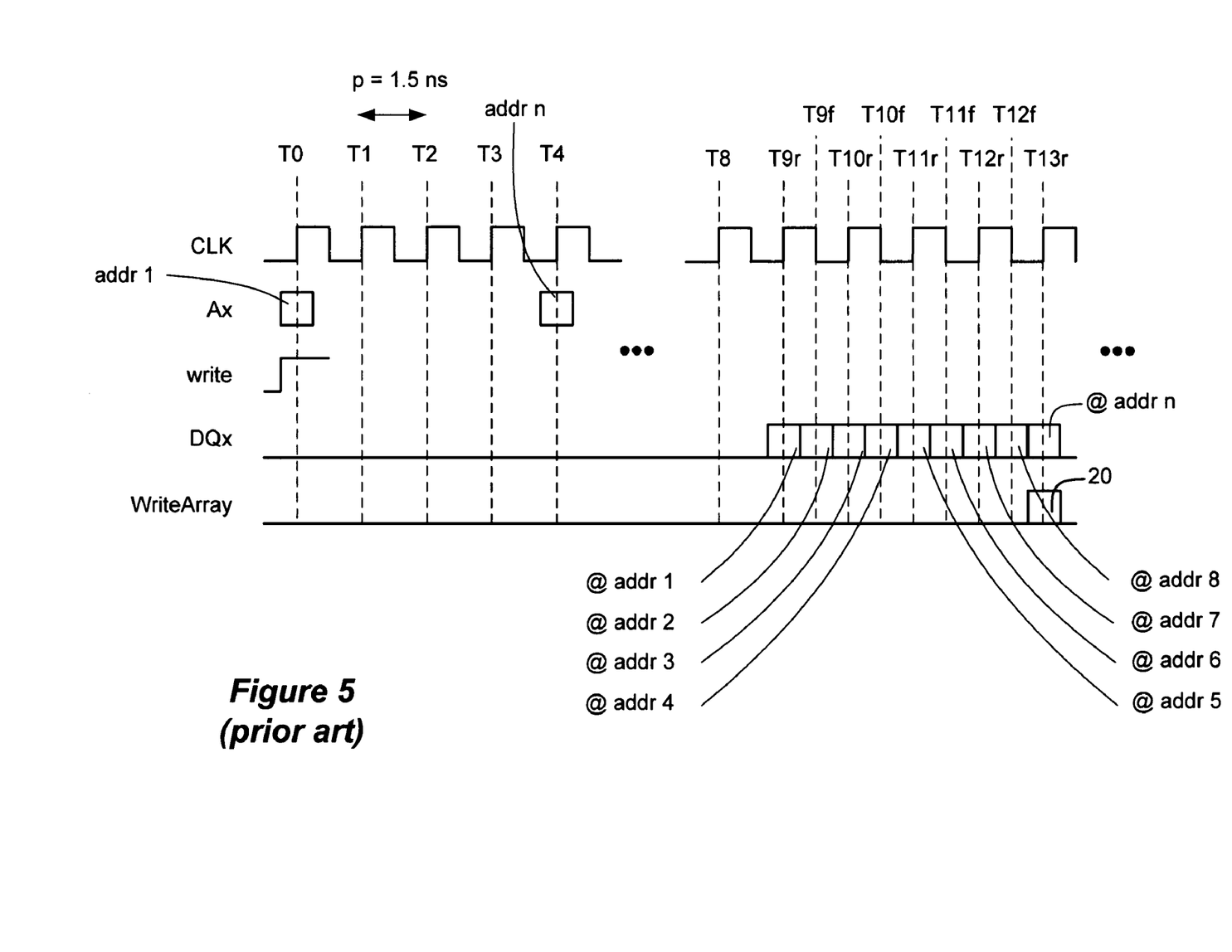
FIG. 5 illustrates the write latency of a DDR3 SDRAM.

Thus, and as illustrated in FIG. 5, when an address (addr 1) is presented to the DDR3 at T0 for writing data to the device, it will be 9 clock cycles until the data corresponding to that address (or those addresses in sequence) is presented by the data bus to the data lines DQx. As with reading, eight bits of data are written into the device at one time, and are captured from T9r to T12f. Once captured, these eight bits are written in parallel into the array at the next fraction of the clock cycle (T13r) in response to a write array pulse 20. Again, so as not to back up the device, a new address (addr n) cannot be fed to the address lines Ax until at least T4r, similarly to what was described when reading the device and as illustrated in FIG. 4. This new address's data is captured on the data lines DQx at T13r though T16f, etc.

Figure 6:
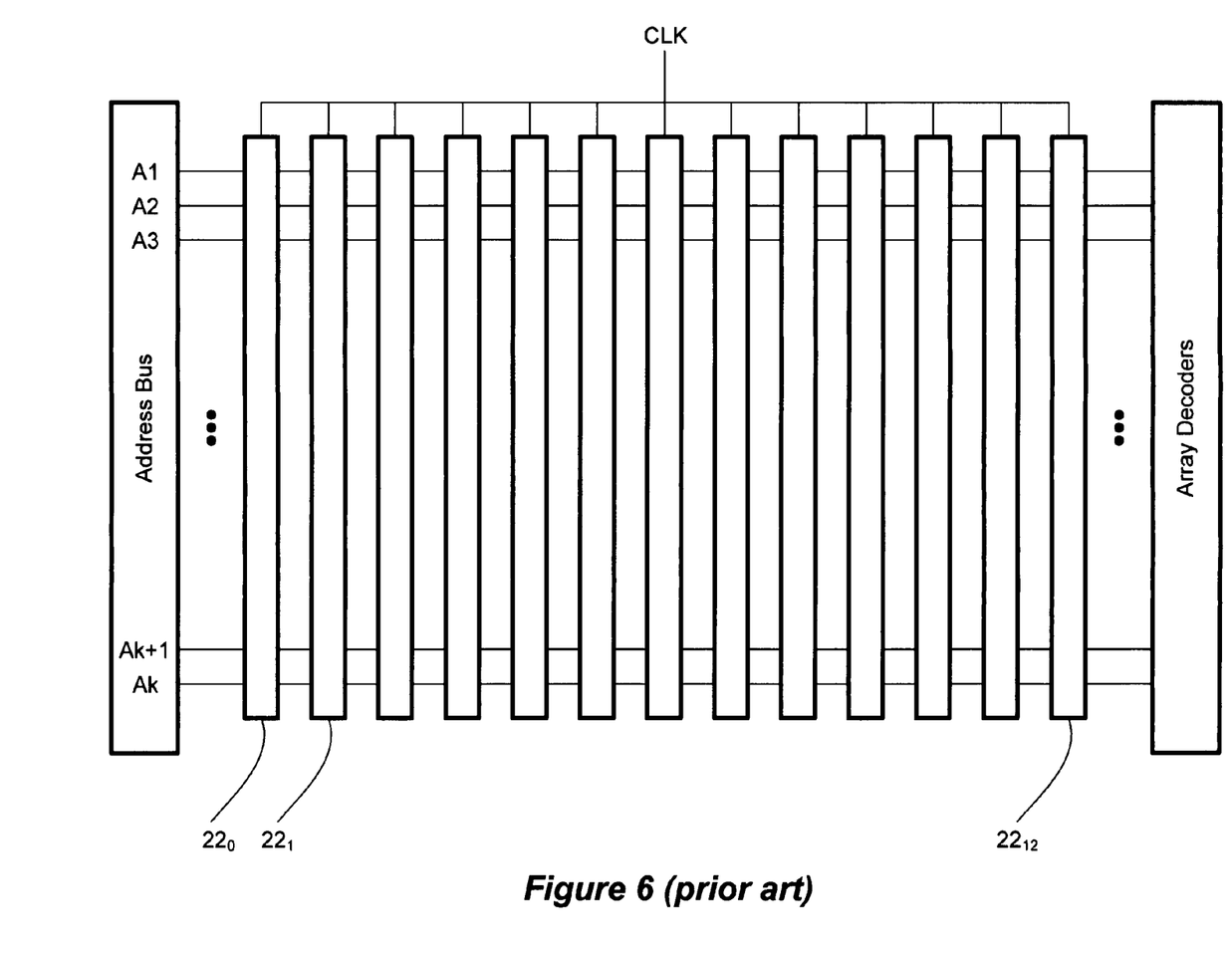
FIG. 6 illustrates the write address shift register structure between the address bus and the array decoders in the DDR3 SDRAM of FIGS. 4 and 5.

This DDR3 writing scheme however requires tracking the write addresses through the device. This is cumbersome, as the actual address at which the data will be stored is not needed until thirteen clock cycles later at T13r. In the prior art, the addresses were organized and flowed through the device in a series of registers, as shown in FIG. 6. Essentially, these registers 22, preferably D flip flops, but can constitute other structures for holding data as well such as latches, and in this sense "register" is used generically throughout this disclosure. The registers shift the pertinent write addresses between the address lines Ax (i.e., address bus) and the array decoders on each clock cycle. Thus, addr 1 would be present in register $22_0$ at T0, then would propagate to register $22_1$ at T1, to register $22_2$ at T2, etc. At T4, the next address, if any or if changed, would be presented to the first register $22_0$, etc. In this way, the device would have the correct address presented from register $22_{12}$ to the array decoders at T13 in time for writing to the array in accordance with the write array signal 20 (see FIG. 5).

This solution of propagating the addresses through the DDR3 is beneficial in that it is relatively simple to implement. However, it also suffers from drawbacks. First, the register structure takes up quite a bit of space on the DDR3 integrated circuit. Specifically, 13 registers are needed in the above-illustrated example, each of which is "k" bits long in accordance with the size of the write addresses that are being propagated. In a device having 17 address bits, a 17-by-13 bit space would thus be used for the register structures. Stated more generically, and assuming P equals the number of bits prefetched by the device, and $WL_{max}$ equals the maximum write latency, the number of registers needed would be the value $WL_{max}+P/2$ rounded up to the next integer (or 9+8/2=13 registers in this example).

Moreover, the relatively large amount of space needed for the register structures seems particularly wasteful when it is realized that a unique address is not input at every clock cycle. As noted above, an address can be entered into the device at a minimum of every four clock cycles, and as shown in the example of FIG. 5, valid addresses are captured by the device at times T0 and T4. For the intervening time periods (T1 through T3), the device merely captures "don't care" address data, which is then propagated through the shift register structure of FIG. 6. Of course, propagating these don't care address values through the register structure is not ideal.

Furthermore, as noted above, the read latency (and thus the write latency) might ideally change depending on the clock speed to be used with the DDR3. For example, while the above example contemplates a clock speed of 1.5 ns and a read latency of 10 (write latency of 9), a 3 ns clock would require only a read latency of 5 (write latency of 4). When this is recognized, it is seen that all thirteen registers 22 are not required, and that a fewer number of registers would be more optimal for use with lower clock speeds. In short, use of lower clock speeds and lower latency values may render some of the registers 22 unnecessary, which is again wasteful. Moreover, the design of the DDR3 device, and specifically the register structure, becomes dictated by the clock speed and latency values to be used. This hampers user flexibility, as a new design would be needed for each new clock speed or latency value to be used, which again is not ideal.

Moreover, as write addresses (including "don't care" addresses) are propagated through the register structure at each clock cycle, current will be necessarily drawn by each register at each clock cycle. This excess current draw is significant, and is preferably minimized.

Accordingly, the art would be benefited by a solution to this problem, and specifically to a solution that simplifies and renders more flexible the write register structure on a DDR3 device. This disclosure provides such a solution.

SUMMARY

Disclosed herein are exemplary embodiments of an improved write address shift register structure useful for example in a DDR3 DRAM having read/write latency. The disclosed shift register structure propagates write addresses from an address bus outside the device to array decoders to allow latent data to be written into the cells in the memory array at a proper time. The register structure comprises a reduced number of registers (e.g., four) thus eliminating the need for extraneous registers which might otherwise be used to propagate "don't care" addresses. The registers are clocked, and the addresses propagated though the registers, in accordance with a latency bus through which a user defines the desired read/write latency in accordance with user preferences and the desired clock speed of the device. The clock for each register is preferably decoded from the latency bus and hence each register preferably has its own unique clock. The disclosed write address shift register structure takes up less area on the DDR3 device, eliminates use of the registers to propagate "don't care" addresses, reduces power requirements, and improves user flexibility by allowing latency values to be programmed.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 11:
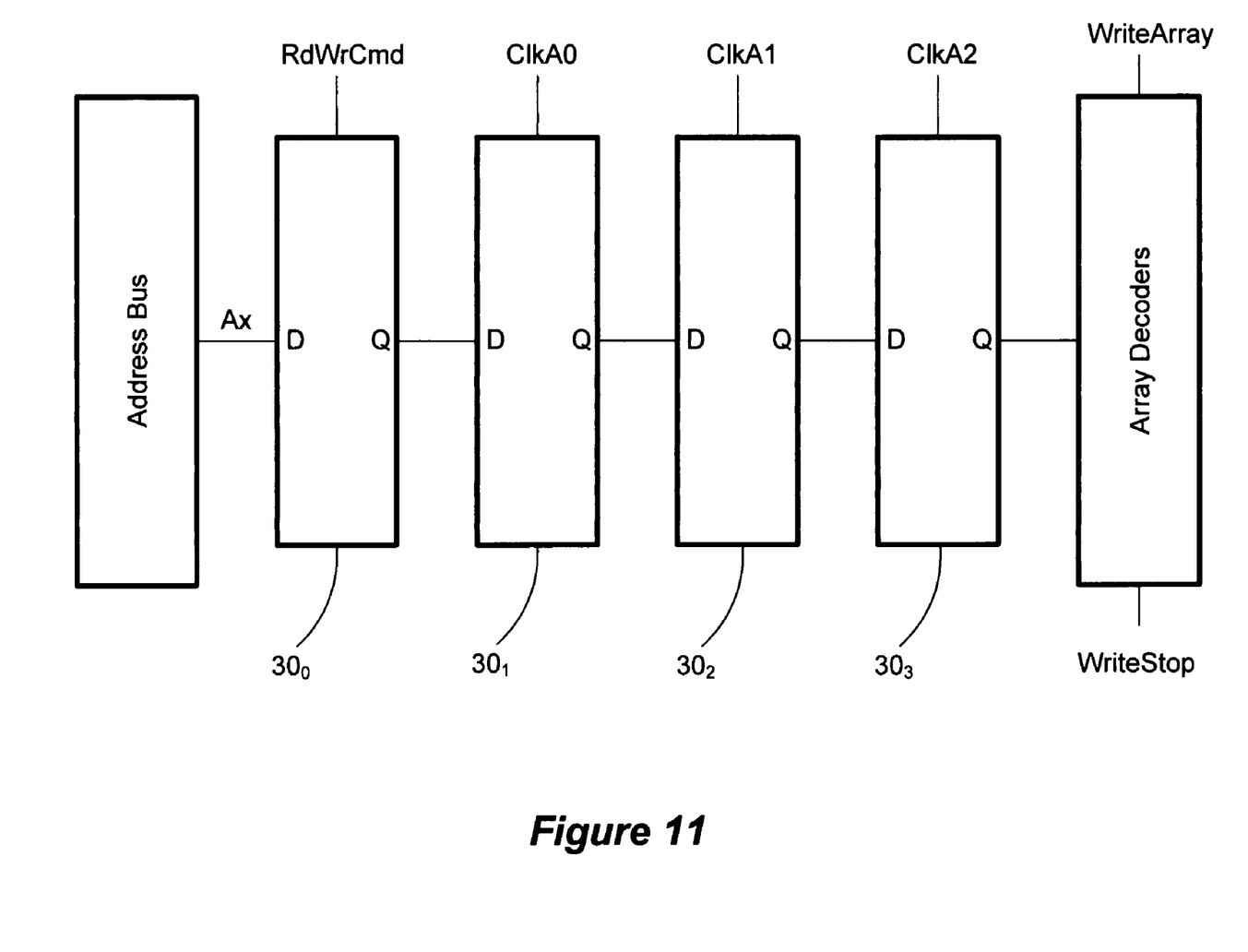
FIG. 11 illustrates the disclosed improved write address shift register structure.

The disclosed improved write address shift register structure is shown in FIG. 11. Like the prior art, the shift register structure comprises a series of registers 30, which preferably comprise D flip flops, but which could comprises other structures as well, such as latches, etc., as mentioned earlier. Four registers are shown, a number significantly reduced from the number of registers occurring in the prior art (see FIG. 6). However, the exact number of registers to be used according to the disclosed techniques will depend upon the worst-case scenario, i.e., the fastest clock speed to be used (and hence the read/write latency) and the DDR technology at issue. For a DDR3, 8-bit prefetch device and assuming a maximum read latency of ten as discussed earlier, a minimum of four registers are needed because that many addresses might be presented to and processed by the device at one time. However, one skilled in the art will appreciate that differing minimum numbers of registers will be useful in other applications and with other types of DDR devices. More specifically, assuming P equals the number of bits prefetched by the device, and $WL_{max}$ equals the maximum write latency, the number of registers needed would be the value $(WL_{max}+P/2)/(P/2)$ rounded up to the next integer. Thus, the for disclosed example, where $WL_{max}=9$, and P=8, this formula yields (9+8/2)/(8/2)=3.25, which when rounded up to the next integer yields 4 registers.

As shown in FIG. 11, and denoting another diversion from the prior art, each of the registers 30 is preferably clocked to move the address data forward in the register structure by a unique register clock signal (RdWrCmd, ClkA0, ClkA1, and ClkA2). It is not imperative that a unique clock signal be used for each register 30 (some but less than all of the registers may use a common clock signal in other useful embodiments), but this is preferred. So designed, the register structure of FIG. 11 holds only the pertinent write addresses truly needed by the array decoders to perform an array write operation 20. In short, no "don't care" addresses are propagated through the register structure.

Figure 12A:
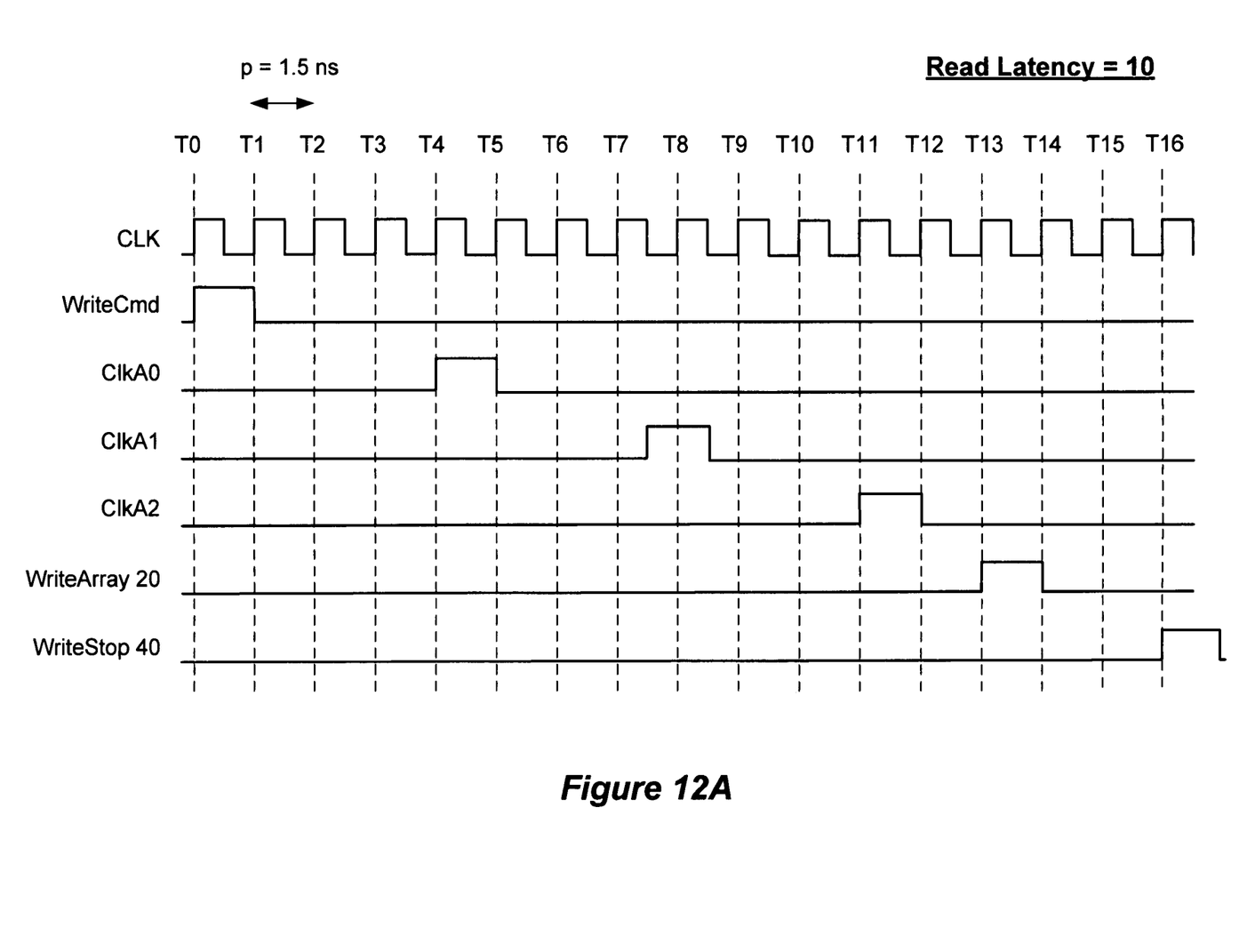
FIGS. 12A and 12B respectively illustrate timing diagrams for the register clock signals for the shift register of FIG. 11 for a read latency of 10 and 5.
Figure 12B:
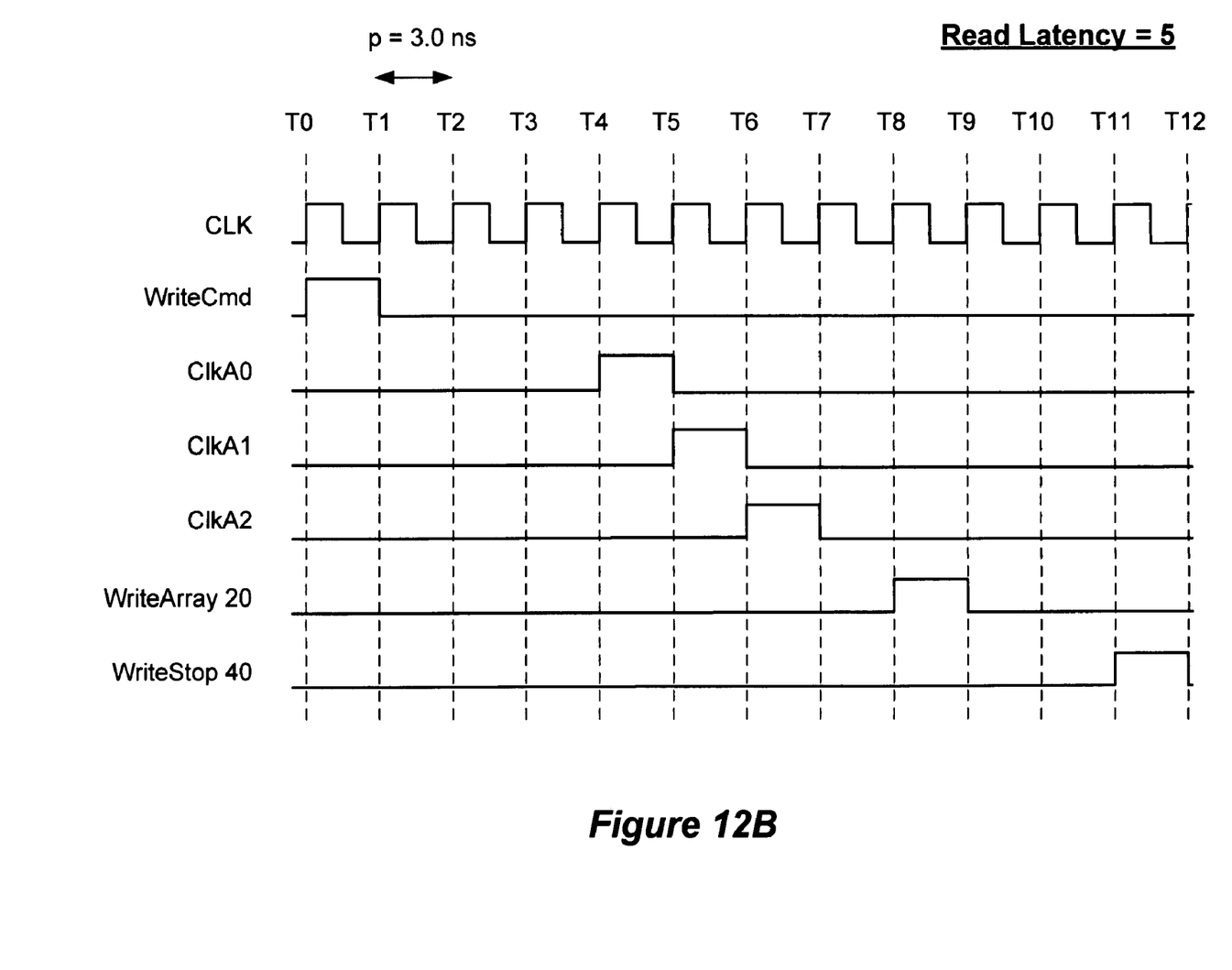

The generation of the register clock signals is accomplished in a useful embodiment by the logic circuitry disclosed in FIGS. 7–10. As one skilled in the art will well understand how such logic circuitry operates, such circuitry is only briefly discussed. It should be noted that the disclosed circuitry is merely exemplary, and constitutes only one of many embodiments for generating the register clock signals. Other logic circuits and configurations may be used to generate the register clock signals, and these clock signals may be applied to the respective registers 30 at different times than those disclosed in FIGS. 12A and 12B (to be discussed later) while still providing the benefits of the disclosed write address propagation scheme.

Figure 7:
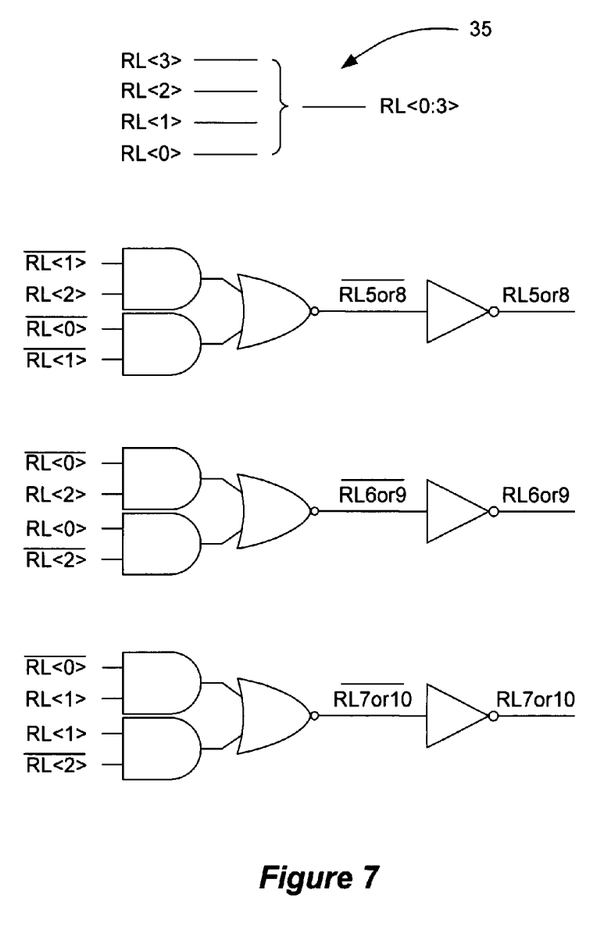
FIGS. 7–10 illustrate logic for decoding a user programmable latency bus and for generating register clock signals to send to the disclosed register structure of FIG. 11.

A central component in the generation of the register structure control signals is the read latency bus 35, as shown in FIG. 7. As shown, the latency bus 35 comprises four lines (RL<0:3>) which indicates the read latency to be used with the device. For example, if a 1.5 ns clock is to be used, requiring a read latency of 10, the signals of the latency bus 35 will represent the number 10 in a binary fashion, e.g.: RL<3>='1', RL<2>='0', RL<1>='1', and RL<0>='0'. If a 3.0 ns clock is to be used, requiring a read latency of 5, the signals of the latency will represent the number 5 in a binary fashion, e.g., RL<3>='0', RL<2>='1', RL<1>='0', and RL<0>='1'. As disclosed in the examples herein, a read latency from 5 to 10 is contemplated, although one skilled in the art will realize that other read latencies could be used, and therefore that this range of values is merely exemplary.

In a preferred embodiment, the read latency as reflected by the latency bus 35 is user programmable. Such user programmability can be accomplished in any number of ways using well-known techniques which don't require detailed elaboration and thus are only briefly discussed. First, the value of the latency bus 35 can be set to fixed values by the user and stored in an appropriate register (not shown) on the device using a special access mode. Second, the latency bus 35 may be mask programmable by selectively coupling the bus lines to power or ground on the device. This approach is less preferred as it requires a mask change for each device requiring a different latency period. Third, fuses or anti-fuses can be opened or shorted to set the value of the latency bus 35. Fourth, the speed of the clock (CLK) may be sensed by the device to allow the appropriate read latency to be determined and set. For example, if the device senses a 1.5 ns clock, it will understand that a read latency is 10 is needed, and will automatically set the bus accordingly. Such schemes and circuitry for sensing clock speeds are well known. This latter approach is beneficial in that it allows the device to be used when the clock speed in the microprocessor system in which the device resides is not known or may vary. While the latency bus 35 preferably constitutes bits indicative of read latency, the bus may also reflect write latency as this is related to the read latency as noted earlier.

Figure 8:
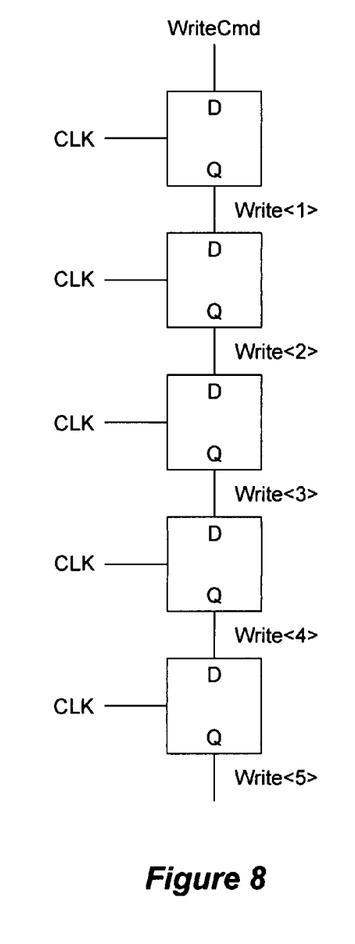

Regardless of the technique used to set the value of the read latency bus 35, the bits of that bus are decoded and processed using the exemplary logic circuitry of FIG. 7 to 10 to allow the register clock signals to be determined. As one skilled in the art understands how the disclosed logic circuitry functions, such circuitry is only briefly discussed. As shown in FIG. 7, the bit of bus 35 are sent to various logic gates (AND and NOR gates) to activate a signal indicative of whether a read latency of 5 or 8, 6 or 9, or 7 or 10 has been user programmed (e.g., RL5 or 8). In parallel, and as shown in FIG. 8, an internal write command (WriteCmd) is sent through a series of flip flops clocked by the main clock signal (CLK) to generate a sequential series of time delayed write signals (Write<X>). One skilled in the art will realize that the WriteCmd signal is generated as a function of the RAS, CAS, and W/E signals external to the device.

Figure 9:
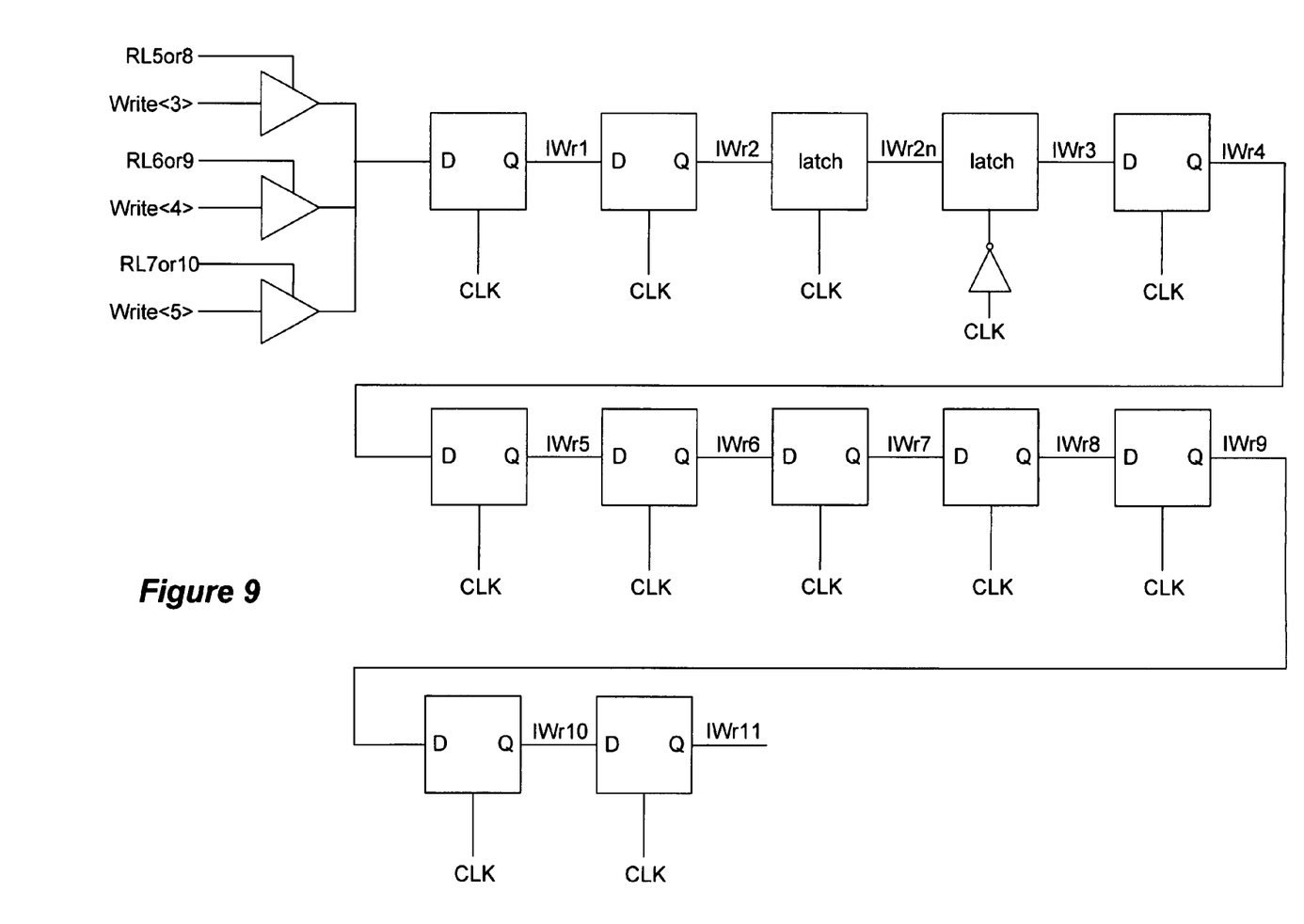
Figure 10:
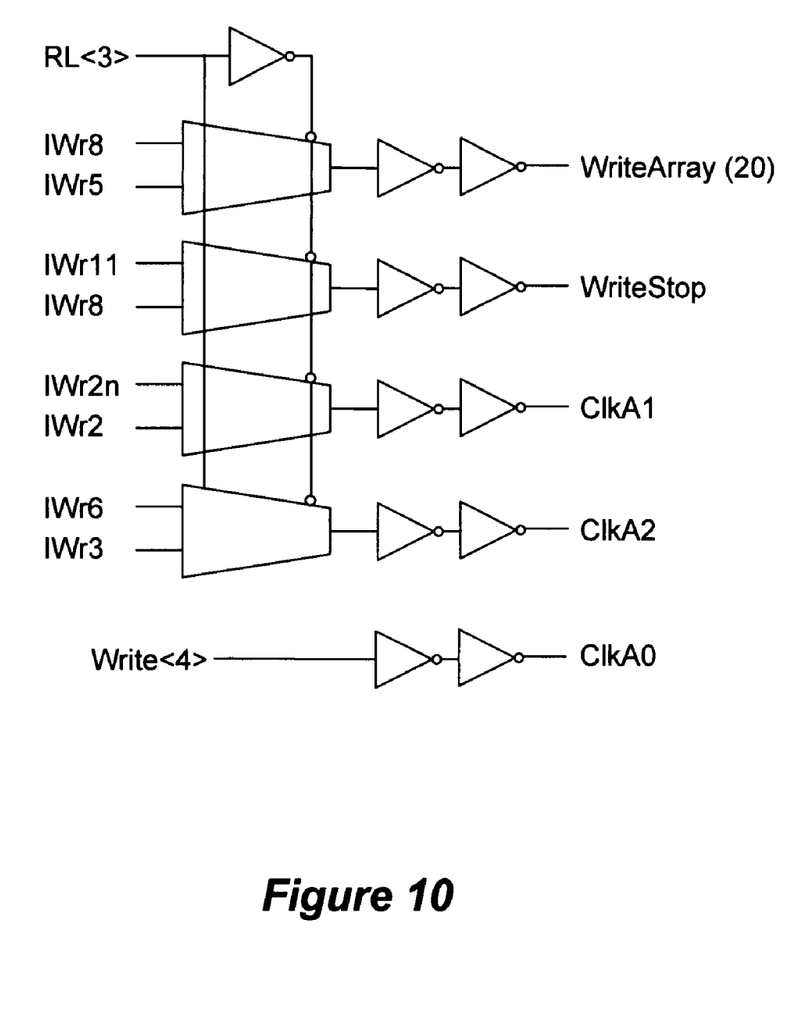

The signals from FIGS. 7 and 8 are sent to the circuit of FIG. 9, which is used to generate various intermediary write signals (IWrX). Specifically, the RLXorY signals gate buffers allowing one of the time delayed versions of Write<X> signals to pass through to a series of flip flops or latches. (As one skilled in the art will recognize, the flip flops route the input (D) to the output (Q) on the rising edge of the clock, while the latches pass the input to the output whenever the latch clock signal is low). The intermediary write signals IWrX are sent to various multiplexers as shown in FIG. 10, which is controlled by the most significant bit RL<3> of the read latency bus 35 to generate the various register 30 clocks (ClkA0, ClkA1, and ClkA2) and signals indicative of when writing of data to the array decoders should start (WriteArray 20) and stop (WriteStop40) (See FIGS. 5, 12A, and 12B). In this example, register clock ClkA0 is logically equivalent to the Write<4> signal.

Accordingly, and as noted earlier, the generated register clock signals are used to clock the registers 11 as shown in FIG. 11. (The first register $30_0$ in this embodiment is actually clocked by a signal indicative of whether the device is in read or write mode (RdWrCmd), which like the WriteCmd signal is generated as a function of the RAS, CAS, and W/E signals external to the device). The timing of these generated register clock signals are shown respectively in FIG. 12A and 12B for the assumed extreme cases of read latency 10 and read latency 5.

Thus, as noted earlier, the disclosed write synchronization scheme requires fewer write address registers than does the prior art, while requiring only minimal logic to allow such size reduction to occur. The write addresses propagate through the write address register structure without needlessly propagating "don't care" addresses. Additionally current is only drawn when addresses are propagated in response to a write command, and is not necessarily drawn upon every iteration of the system clock. Moreover, the read latency value is programmable, thus allowing the minimal number of registers to be used over a latency range without wasted resources, reducing device power requirements.

While disclosed as being particularly useful with DDR3 technologies, one skilled in the art will appreciate that the disclosed write synchronization scheme can be used with similar benefits to SDRAMs, other generations of DDR technology including those to be developed in the future, other memory devices, and generically to any integrated circuit device requiring write address synchronization such as microprocessors.

It should be understood that the inventive concepts disclosed herein are capable of many modifications. To the extent such modifications fall within the scope of the appended claims and their equivalents, they are intended to be covered by this patent.

What is claimed is:

1. A method for synchronizing addresses with latent data corresponding to those addresses in an integrated circuit having a system clock and a memory array, comprising:
shifting the addresses through a plurality of shift registers, wherein each shift register shifts the addresses in accordance with a received register clock signal, and wherein not all of the shift registers receive the same register clock signal.

2. The method of claim 1, wherein each of the plurality of shift registers receives a unique register clock signal not received by any other shift register.

3. The method of claim 1, wherein none of the plurality of shift registers comprises don't care address data.

4. The method of claim 1, wherein the timing of the register clock signals are indicative of a latency period.

5. The method of claim 4, wherein the latency period is programmed by the user.

6. The method of claim 4, wherein register clock signals are derived from the latency period.

7. The method of claim 1, wherein the register clock signals do not constitute the system clock.

8. A method for synchronizing addresses with latent data corresponding to those addresses in an integrated circuit having a system clock and a memory array, comprising:
shifting the addresses through a plurality of shift registers, wherein each shift register shifts the addresses in accordance with a received register clock signal, and wherein the register clock signals do not constitute the system clock.

9. The method of claim 8, wherein the system clock is external to the integrated circuit.

10. The method of claim 8, wherein each of the plurality of shift registers receives a unique register clock signal not received by any other shift register.

11. The method of claim 8, wherein none of the plurality of shift registers comprises don't care address data.

12. The method of claim 8, wherein the timing of the register clock signals are indicative of a latency period.

13. The method of claim 12, wherein the latency period is programmed by the user.

14. The method of claim 12, wherein register clock signals are derived from the latency period.

15. A method for synchronizing addresses with latent data corresponding to those addresses in an integrated circuit having a system clock and a memory array, comprising:
setting a latency period in the integrated circuit; and
shifting the addresses through a plurality of shift registers, wherein each shift register shifts the addresses in accordance with a received register clock signal, and wherein at least some of the register clock signals are derived from the latency period.

16. The method of claim 15, wherein each of the plurality of shift registers receives a unique register clock signal not received by any other shift register.

17. The method of claim 15, wherein none of the plurality of shift registers comprises don't care address data.

18. The method of claim 15, wherein the latency period is indicated in a latency bus.

19. The method of claim 15, wherein the register clock signals do not constitute the system clock.

20. A method for synchronizing addresses with latent data corresponding to those addresses in an integrated circuit having a system clock and a memory array, comprising:
shifting the addresses through a plurality of shift registers, wherein each shift register shifts the addresses in accordance with a unique register clock signal, and wherein no shift register comprises don't care address data.

21. The method of claim 20, wherein the timing of the register clock signals are indicative of a latency period.

22. The method of claim 21, wherein the latency period is programmed by the user.

23. The method of claim 21, wherein register clock signals are derived from the latency period.

24. The method of claim 20, wherein the register clock signals do not constitute the system clock.

25. An integrated circuit having a system clock and a memory array in which addresses are synchronized with latent data corresponding to those addresses in accordance with a system clock, comprising:
a plurality of shift registers for shifting the addresses between an address bus and a memory array, wherein the shift registers shifts the addresses in accordance with a plurality of register clock signals; and
logic to process a latency period into at least some of the plurality of register clock signals.

26. The integrated circuit of claim 25, wherein each of the plurality of shift registers receives a unique register clock signal not received by any other shift register.

27. The integrated circuit of claim 25, wherein the latency period is programmed by the user.

28. The integrated circuit of claim 25, wherein not all of the shift registers receive the same register clock signal.

29. The integrated circuit of claim 25, wherein the register clock signals do not constitute the system clock.

30. An integrated circuit having a system clock and a memory array in which addresses are synchronized with latent data corresponding to those addresses in accordance with a system clock, comprising:
a plurality of shift registers for shifting the addresses from an address bus to decoders of a memory array, wherein the shift registers shifts the addresses in accordance with a plurality of register clock signals, wherein the number of the plurality of shift registers is less than the value of a maximum latency period between a latent data and an address corresponding to that latent data; and
logic to process the latency period into at least some of the plurality of register clock signals.

31. The integrated circuit of claim 30, wherein each of the plurality of shift registers receives a unique register clock signal not received by any other shift register.

32. The integrated circuit of claim 30, wherein the latency period is programmed by the user.

33. The integrated circuit of claim 30, wherein the register clock signals do not constitute the system clock.

* * * * *